United States Patent
Hyun et al.

(10) Patent No.: US 10,747,980 B2
(45) Date of Patent: Aug. 18, 2020

(54) DISPLAY DEVICE

(71) Applicant: LG Display Co., Ltd., Seoul (KR)

(72) Inventors: Joobong Hyun, Paju-si (KR); Kyoseop Choo, Paju-si (KR); Seungman Ryu, Paju-si (KR); Ara Yoon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 115 days.

(21) Appl. No.: 16/103,553

(22) Filed: Aug. 14, 2018

(65) Prior Publication Data
US 2019/0057238 A1 Feb. 21, 2019

(30) Foreign Application Priority Data
Aug. 16, 2017 (KR) .......................... 10-2017-0103812

(51) Int. Cl.
*G06K 9/00* (2006.01)
*G02B 6/42* (2006.01)
*H01L 27/146* (2006.01)

(52) U.S. Cl.
CPC ......... *G06K 9/0004* (2013.01); *G02B 6/4206* (2013.01); *G02B 6/4213* (2013.01); *H01L 27/14678* (2013.01)

(58) Field of Classification Search
CPC ............. G06K 9/0004; G06K 9/00046; G06K 9/00013; H01L 27/14678; G02B 6/4206; G02B 6/4213; G09F 9/00
See application file for complete search history.

(56) References Cited

U.S. PATENT DOCUMENTS

| 5,732,148 A * | 3/1998 | Keagy ................ G06K 9/00046 356/71 |
| 8,624,853 B2 | 1/2014 | Han et al. |
| 9,207,637 B2 * | 12/2015 | Pyun .................... G03H 1/0476 |

(Continued)

FOREIGN PATENT DOCUMENTS

| KR | 2005-0000455 A | 1/2005 |
| KR | 10-0608171 B1 | 8/2006 |

(Continued)

OTHER PUBLICATIONS

Combined Search and Examination Report, United Kingdom Patent Application No. GB1813384.3, dated Jan. 29, 2018, 5 pages.

*Primary Examiner* — Bobbak Safaipour
(74) *Attorney, Agent, or Firm* — Fenwick & West LLP (57) ABSTRACT

Disclosed herein is a display device capable of recognizing a fine fingerprint without a complicated construction such as a bulky optical device. The display device comprises a display panel having a display area and a non-display area outside the display area; a light source disposed below the non-display area of the display panel to irradiate the display panel with light; a directional light unit disposed on an upper portion of the display panel, refracting the light supplied from the light source at a first angle to travel from the non-display area to the display area in total internal reflection, reflecting some of the totally internally reflected light at a second angle, and then supplying a light reflected by an object having biometric information to the display panel; and an optical sensor disposed below the display panel and receiving the light exited from the directional light unit.

15 Claims, 5 Drawing Sheets

(56) References Cited

U.S. PATENT DOCUMENTS

2007/0253042 A1* 11/2007 Szarvas .................. G03H 1/26
 359/22
2008/0012850 A1* 1/2008 Keating, III ......... H04N 13/207
 345/419
2010/0302185 A1 12/2010 Han et al.
2012/0268427 A1 10/2012 Slobodin
2012/0328170 A1 12/2012 Wu et al.
2016/0225397 A1* 8/2016 Yu ........................ G11B 7/1381

FOREIGN PATENT DOCUMENTS

| KR | 10-2012-0090020 A | 8/2012 |
| KR | 10-2014-0022843 A | 2/2014 |
| KR | 10-2016-0043216 A | 4/2016 |

* cited by examiner

DISPLAY DEVICE

CROSS-REFERENCE TO RELATED APPLICATION

This application claims priority to Republic of Korea Patent Application No. 10-2017-0103812 filed on Aug. 16, 2017 with the Korean Intellectual Property office, which is incorporated herein in its entirety.

BACKGROUND

Field of Technology

This disclosure relates to a display device, in particular to a display device capable of recognizing a fingerprint using a directional light.

Description of the Related Art

In recent years, according to development of information communication technology, various information and communication based systems such as notebook computers, tablets, personal computers (PC), smartphones, personal digital assistants (PDA), automated teller machines, and search guidance systems have been developed. As these systems typically store a lot of confidential data such as personal information related to personal privacy as well as business information and trade secret, it is required to enhance security in order to protect the confidential data.

To do so, one method has been suggested for enhancing the security using an image sensor capable of recognizing a user's biological information. For example, a fingerprint sensor can enhance the security of the systems by registering and authenticating a fingerprint of the user's finger. The fingerprint sensor is for sensing the fingerprint of the user. As the fingerprint sensor, an optical fingerprint sensor has been widely known.

The optical fingerprint sensor uses a principle of irradiating lights using a light source such as a light emitting diode (LED), and detecting the lights reflected by ridges of the fingerprint using a complementary metal oxide semiconductor (CMOS) image sensor. As the optical fingerprint sensor has to scan the fingerprint using the LED, it is required to equip an additional device for scanning the fingerprint. The additional device increases the size of the optical fingerprint sensor, and thus there are limitations in various applications such as combining with a display device.

Conventional display devices are configured so that display areas of the display devices can be used as touch areas and fingerprint recognition areas. However, the optical fingerprint sensor uses diffuse light with a significantly lower directionality or directivity as light for recognizing the fingerprint. Therefore, there is a limitation in recognizing patterns of the fingerprint.

As described above, in the display device having the conventional optical fingerprint sensor, it is difficult to accurately recognize a fingerprint. In order to accurately recognize a fingerprint, a complicated and bulky optical device is required. Accordingly, it is difficult for them to be combined with a portable display device.

SUMMARY

An object of this disclosure is to provide a display device capable of recognizing a fine fingerprint without a complicated construction such as a bulky optical device.

Another object of this disclosure is to provide a display device suitable for a display panel with an increased display area and a reduced bezel area.

A display panel according to this disclosure includes a display panel having a display area and a non-display area outside the display area; a light source disposed below the non-display area of the display panel to irradiate the display panel with light; a directional light unit disposed on an upper portion of the display panel, refracting the light supplied from the light source at a first angle to travel from the non-display area to the display area in total internal reflection, reflecting some of the totally internally reflected light at a second angle, and then supplying a light reflected by an object having biometric information to the display panel; and an optical sensor disposed below the display panel and receiving the light exited from the directional light unit.

The directional light unit may include a cover substrate disposed to face the display panel to be contacted with the object; an optical element including a light-exiting element disposed between the cover substrate and the display panel in at least a portion of a region where the light from the light source travels at a position corresponding to the display area; and a light-incident element disposed between the cover substrate and the display panel to be overlapped with the light source at a position corresponding to the non-display area; and a first low refractive layer disposed between the optical element and the display panel.

The directional light unit may further include a second low refractive layer disposed between the optical element and the cover substrate.

The directional light unit may further include an adhesive layer disposed between the optical element and the cover substrate; and a black matrix disposed to correspond to the optical element between the cover substrate and the adhesive layer to block some of the light irradiated from the light source.

The directional light unit may further include a black matrix disposed to correspond to the light-incident element between the cover substrate and the second low refractive layer to block some of the light irradiated from the light source.

The directional light unit may further include an adhesive layer disposed between the optical element and the second low refractive layer; and a black matrix disposed to correspond to the light-incident element between the adhesive layer and the second low refractive layer to block some of the light irradiated from the light source.

The light-incident element refracts some of the light incident from the light source at a first angle which causes total internal reflection in the cover substrate and progresses it to the cover substrate. The light totally internally reflected from an upper surface of the cover substrate and traveling to the light-exiting element is reflected at a second angle smaller than the first angle by the first low refractive layer to be traveled to the cover substrate, and is traveled to the optical sensor after being reflected by the object on the cover substrate.

The light-incident element refracts some of the light incident from the light source at a third angle which causes total internal reflection in the optical element and progresses it to the optical element. The light totally internally reflected from an upper surface of the optical element and traveling to the light-exiting element is reflected at a fourth angle smaller than the third angle to be traveled to the cover substrate, and is travelled to the optical sensor after being reflected by the object on the cover substrate.

The light-incident element refracts some of the light incident from the light source at a fifth angle which causes total internal reflection in the adhesive layer and progresses it to the adhesive layer. The light totally internally reflected from an upper surface of the adhesive layer and traveling to the light-exiting element is reflected at a sixth angle smaller than the fifth angle to be traveled to the cover substrate, and is travelled to the optical sensor after being reflected by the object on the cover substrate.

Refractive indexes of the cover substrate, the adhesive layer, and the optical element are the same, and the refractive index of the cover substrate is larger than a refractive index of the first low refractive layer.

Refractive indexes of the cover substrate and the optical element are the same, a refractive index of the first low refractive layer is the same as that of the second low refractive layer, and a refractive index of the cover substrate is larger than that of the first low refractive layer.

Refractive indexes of the cover substrate, the adhesive layer and the optical element are the same, a refractive index of the first low refractive layer is the same as that of the second low refractive layer, and a refractive index of the cover substrate is larger than that of the first low refractive layer.

The display panel further comprises a polarizing plate disposed between the display panel and the first low refractive layer, and the polarizing plate, the first low refractive layer, and the optical element have the same size.

The display panel further comprises signal lines of arranged to bypass a region overlapping the light-incident element of the optical element and the light source.

The object includes a fingerprint in which a plurality of ridges and a plurality of valleys are alternately arranged In the display device according to this disclosure described above, it is possible to reconstruct an image sensed using a directional light unit and an optical sensor. Therefore, it is possible to correctly recognize a fine fingerprint without a complicated structure such as a bulky optical apparatus.

In addition, it is possible to easily adapt to a display panel having a reduced bezel area (non-display area) since a light-incident element of optical element and a light source are disposed on the non-display portion of the display panel.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Hereinafter, embodiments of this disclosure are described in detail with reference to the accompanying drawings. In the specification, the same reference numerals denote the same elements. In the following description, a detailed description of the known functions and constitutions will be omitted if it is deemed to obscure the embodiments of the present invention. Furthermore, the names of elements used in the following description have been selected by taking into consideration only the ease of writing this specification and may be different from the names of actual parts. Also, as an example of the touch sensor integrated type display device, a touch sensor integrated type liquid crystal display device will be described in detail.

A display device according to an embodiment of this disclosure is described below with reference to FIGS. 1A and 1B.

Figure 1A:
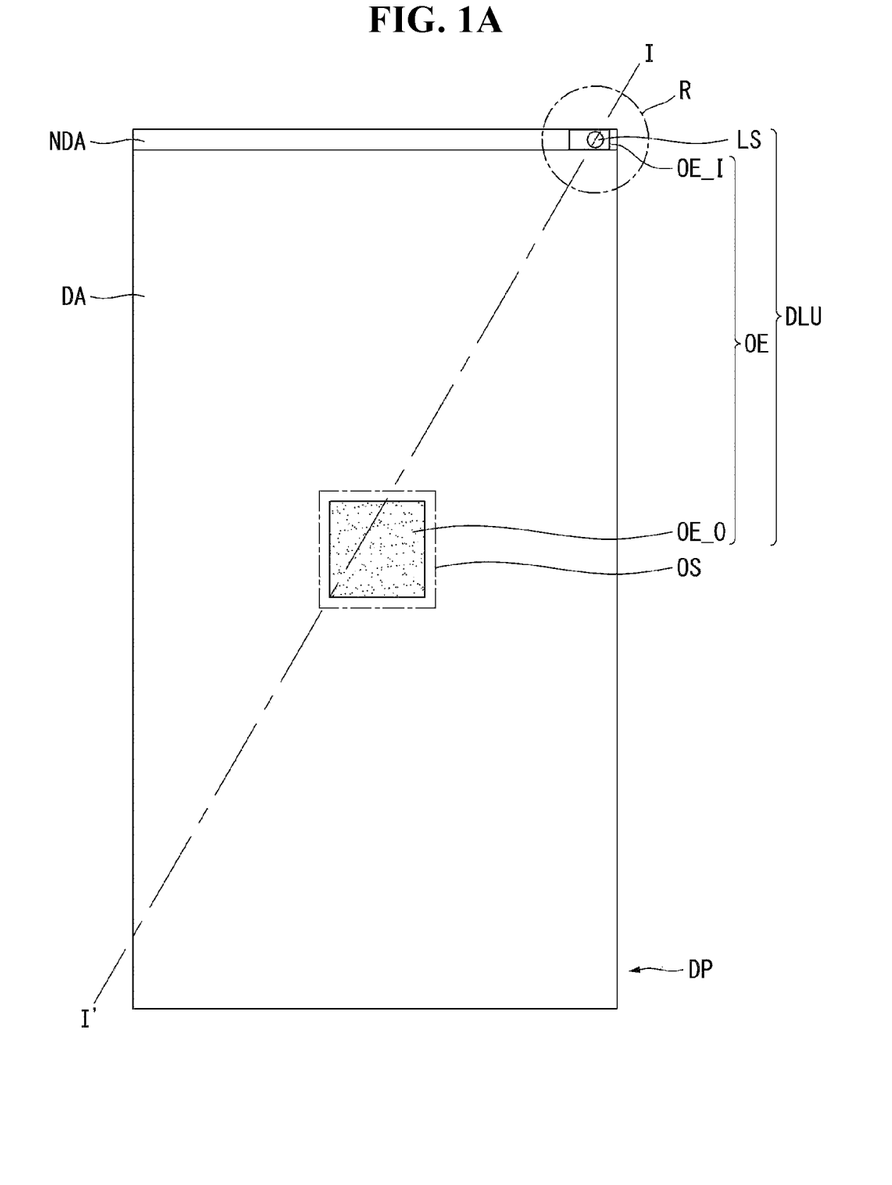
FIG. 1A is a planar view illustrating a display device according to an embodiment of this disclosure.
Figure 1B:
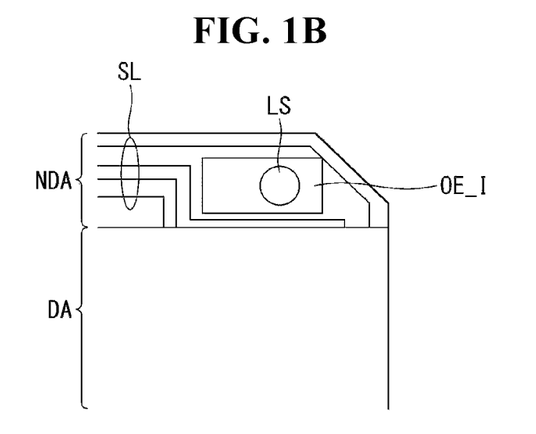
FIG. 1B is an enlarged planar view for illustrating a region R shown in FIG. 1A according to an embodiment of this disclosure.

FIG. 1A is a planar view illustrating a display device according to an embodiment of this disclosure, and FIG. 1B is an enlarged planar view for illustrating a region R shown in FIG. 1A.

Referring to FIGS. 1A and 1B, the display device according to the embodiment of this disclosure includes a display panel DP having a display area DA and a non-display area NDA, a directional light unit DLU coupled with the display panel DP, and an optical sensor OS.

As the display panel DP, any display panel may be used as long as the non-display area NDA can transmit light. In typical, a display panel of an electroluminescent display device using a flexible translucent substrate may be used. A plurality of signal lines SL for supplying various control signals and data signals to display elements of the display area DA may be disposed in the non-display area NDA of the display panel DP. It is preferable that the plurality of signal lines SL are disposed to avoid a light source LS of the directional light unit DLU and a light-incident element OE_I of an optical element OE so as not to obstruct a path of the light supplied from the light source LS.

The directional light unit DLU may include the light source LS, the optical element OE, and a cover substrate (not shown).

The light source LS is disposed below the non-display area NDA of the display panel DP to irradiate the display panel DP with light. It is preferable to use a light source that supplies a collimated light capable of providing a light having a high collimation, such as an infrared laser.

The optical element OE refracts the light supplied from the light source LS at a first angle to travel the light from the non-display area NDA to the display area DA in a total internal reflection, and then reflects some of the totally internally reflected light at a second angle smaller than the first angle. And then, the optical element OE supplies the light reflected by an object having biometric information to the display panel DP.

Figure 2:
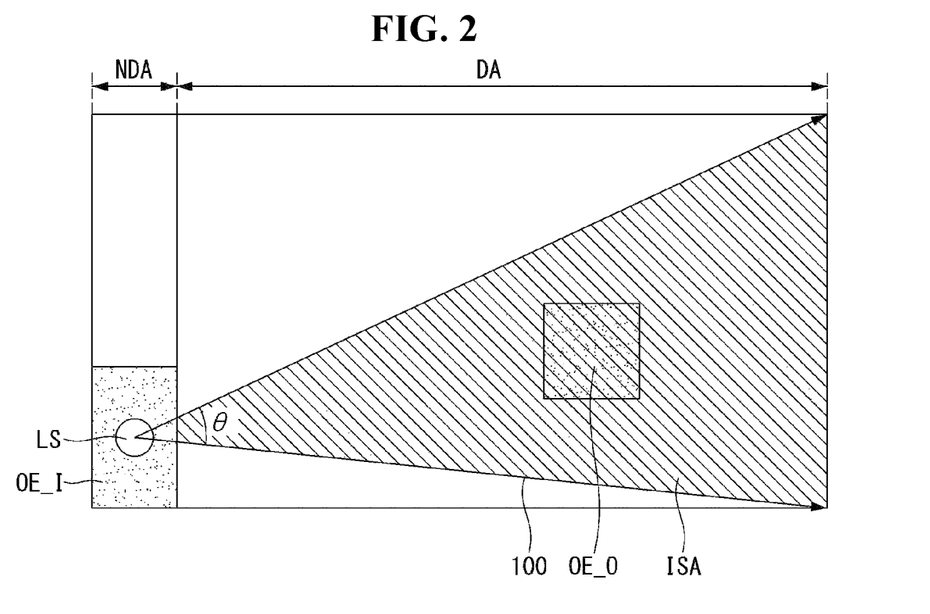
FIG. 2 is a planar view illustrating an optical element included in a directional light unit of the display device shown in FIG. 1A according to an embodiment of this disclosure.

The optical element OE includes a light-incident element OE_I and the light-exiting element OE_O separated from each other at a predetermined distance. The light-incident element OE_I and the light-exiting element OE_O are transparent holographic recording films, and the refractive index of each of the light-incident element OE_I and the light-exiting element OE_O may be the same as or slightly larger than that of a cover substrate.

The light-incident element OE_I converts the light supplied from the light source LS into a progressing light. The progressing light is converted to have a constant diffusion angle $\Theta$ in a horizontal plane consisting of a longitudinal axis and a widthwise axis. Also, the progressing light maintains its original collimated state in a vertical plane consisting of the longitudinal axis and a thickness direction axis. The diffusion angle $\theta$ may be set to be equal to or larger than an inner angle formed by two line segments connecting an incident point at which light is incident and the two end points of the other side of the cover substrate shown in FIG. 2. The progressing light advances while spreading in a triangular shape having the diffusion angle $\theta$. The triangular area occupied by the diffusion of the progressing light becomes an image recognition area ISA.

If no object is present on a surface of the cover substrate, the progressing light 100 may be totally internally reflected in the cover substrate to travel inside the cover substrate. However, if there is an object on the surface of the cover substrate, some of the progressing light 100 are refracted by the object and is exited to the outside of the cover substrate CS. For example, if an object having biometric information is brought into contact with the image recognition area ISA of the cover substrate CS, some of the light is reflected or absorbed by the object, and some of the light is reflected and propagated inside the cover substrate.

Specifically, the object having biometric information may include a finger having a fingerprint in which a plurality of ridges and a plurality of valleys are alternately arranged. If the object is a finger, the progressing light travelling to the ridge portion of the fingerprint of the finger is absorbed by the ridge of the fingerprint and is exited to the outside of the cover substrate. On the other hand, the progressing light travelling to the valley portion of the fingerprint is reflected in the cover substrate and proceeds.

The light-exiting element OE_O exits some of the progressing light 100 travelling inside the cover substrate to the display panel DP. If an object having an image (for example, a human finger having a fingerprint) is touched on the upper surface of the cover substrate CS, the light-exiting element OE_O makes some of the light refracted by the finger to be supplied to the display panel DP.

The cover substrate may include a predetermined area capable of recognizing the object having biometric information. The predetermined area may be taken from a portion area of the image sensing area as shown in FIG. 2. The cover substrate CS can be made of transparent reinforced glass with a refractive index of about 1.5.

The optical sensor OS receives the light exited through the optical element OE and supplies the light to a host system (not shown).

On the other hand, the directional light unit DLU may further include a low refractive layer or the like. The specific configuration of the directional light unit DLU will be described later in detail with reference to FIGS. 3A to 5B.

In the display device according to this disclosure described above, it is possible to reconstruct an image sensed using the directional light unit DLU and the optical sensor OS. Therefore, it is possible to correctly recognize a fine fingerprint without a complicated structure such as a bulky optical apparatus.

A display device according to a first embodiment of this disclosure is described below with reference to FIGS. 3A and 3B.

Figure 3A:
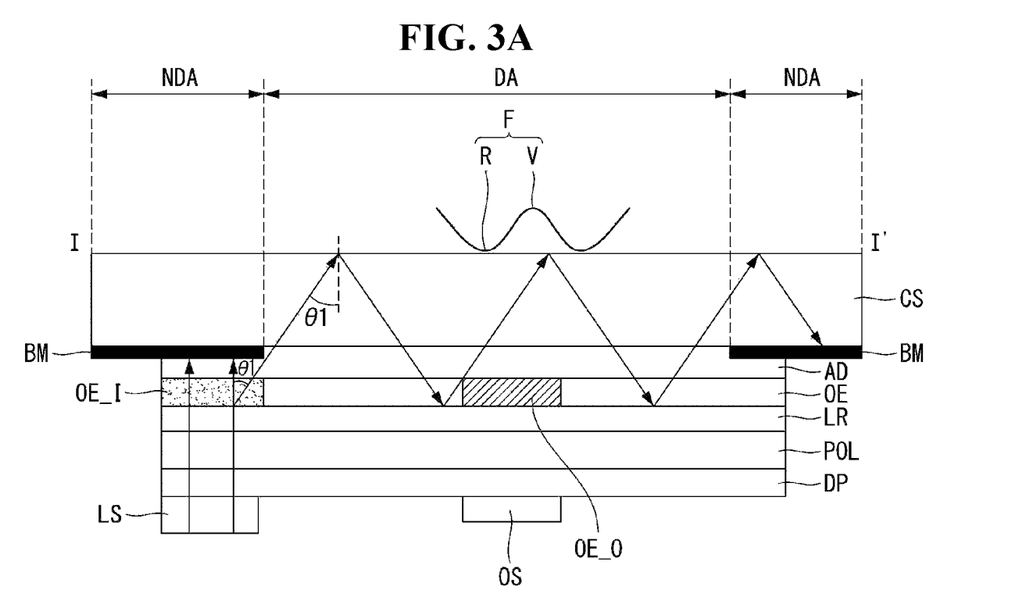
FIG. 3A is a cross-sectional view illustrating a display device according to a first embodiment of this disclosure taken along a line I-I' shown in FIG. 1A, and showing a light path traveling through a total internal reflection in the directional light unit according to an embodiment of this disclosure.

FIG. 3A is a cross-sectional view illustrating a display device according to a first embodiment of this disclosure taken along a line I-I' shown in FIG. 1A, and showing a light path traveling through a total internal reflection in the directional light unit. FIG. 3B is a cross-sectional view illustrating a display device according to the first embodiment of this disclosure taken along a line I-I' shown in FIG. 1A, and showing a light path in which the light refracted by a light-exiting element of the optical element is converged on an optical sensor.

Figure 3B:
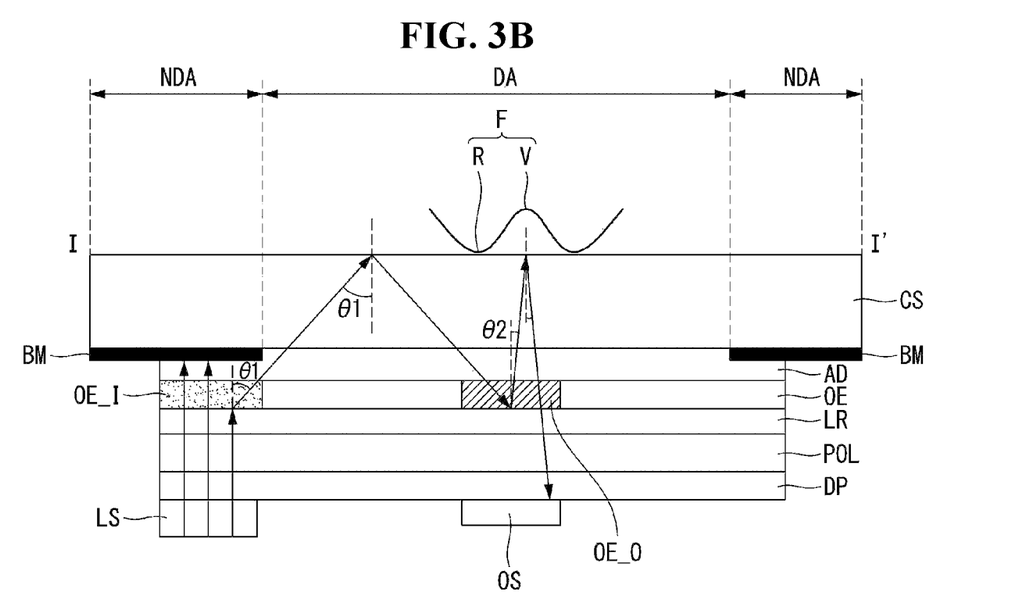
FIG. 3B is a cross-sectional view illustrating a display device according to the first embodiment of this disclosure taken along a line I-I' shown in FIG. 1A, and showing a light path in which the light refracted by a light-exiting element of the optical element is converged on an optical sensor according to an embodiment of this disclosure.

Referring to FIGS. 3A and 3B, the display device according to the first embodiment of this disclosure includes a display panel DP having a display area DA and a non-display area NDA, a light source LS disposed to correspond to the non-display area NDA, a directional light unit coupled with the display panel DP to progress and exit the light from the light source LS, and an optical sensor OS which senses or detects the light from the directional light unit DLU.

As the display panel DP, any display panel may be used as long as the non-display area NDA can transmit light. In typical, a display panel of an electroluminescent display device using a flexible translucent substrate may be used. However, this disclosure is not limited thereto. A liquid crystal display (LCD), a plasma display panel (PDP), a field emission display (FED) or the like may be used in this disclosure if their non-display areas can transmit light. A polarizing plate POL may be attached to an upper side of the display panel DP to improve visibility.

The light source LS is disposed below the non-display area NDA of the display panel DP to irradiate the display panel DP with light. The light source LS may be a light source that supplies a collimated light capable of providing a light having a high collimation, such as an infrared laser in one embodiment.

The directional light unit may include a cover substrate CS, a low refractive layer LR and the light source LS. The directional light unit refracts the light supplied from the light source LS to progress it from the non-display area NDA to the display area DA in a total internal reflection, reflects some of the totally internally reflected light, and supplies the light reflected by the object having biometric information to the display panel DP and the optical sensor OS.

The cover substrate CS may include a predetermined area capable of recognizing the object having biometric information. The cover substrate CS can be made of transparent reinforced glass with a refractive index of about 1.5. A black matrix BM may be attached to the edge of the cover substrate CS to correspond to the light source LS. The object having biometric information may include a finger having a fingerprint F in which a plurality of valleys V and a plurality of ridges R are alternately arranged.

The low refraction layer LR is disposed between the cover substrate CS and the display panel DP. It is preferable that the low refraction layer LR has a refractive index lower than that of the cover substrate CS. The refractive index of the low refractive layer LR is preferably similar to the refractive index of the object to be recognized. For example, if the display device of this disclosure is applied to fingerprint recognition, the low refractive layer LR may have a refractive index of about 1.4 similar to the refractive index of human skin of 1.39.

The optical element OE is disposed between the cover substrate CS and the low refractive layer LR and may include the light-incident element OE_I and the light-exiting element OE_O. The light-incident element OE_I and the light-exiting element OE_O are transparent holographic recording films. The refractive index of the light-incident element OE_I and the light-exiting element OE_O may be the same as or slightly larger than that of the cover substrate CS.

The light-incident element OE_I is disposed to correspond to the non-display area NDA, and is arranged so as to overlap the black matrix BM and the light source LS. The light-incident element OE_I refracts some of the light incident from the light source LS at a first angle θ1 which causes total internal reflection in the cover substrate CS, and progresses it to the cover substrate CS. Since the progressing light has already been described with reference to FIG. 2, further explanation is omitted.

The light-exiting element OE_O may be disposed in at least a portion of area where light from the light source LS travels at a position corresponding to at least a portion of the image recognition area ISA defined by the progressing light. In this case, the light-exiting element OE_O may be disposed at a predetermined distance from the light-incident element OE_I. The light-exiting element OE_O reflects the incident light at a second angle θ2 smaller than the first angle θ1 and exits the reflected light to the cover substrate CS. The light is reflected by the object and is progressed to the display panel DP and an optical sensor OS.

The optical sensor OS is disposed outside the display panel DP at a position corresponding to the light-exiting element OE_O of the optical element OE. The optical sensor OS senses the amount of light transmitted through the display panel DP.

An adhesive layer AD may be further disposed between the cover substrate CS and the optical element OE. The adhesive layer AD is for coupling the cover substrate CS with the optical element OE. The refractive index of the adhesive layer AD may be substantially the same as that of the cover substrate CS.

In the embodiment of FIGS. 3A and 3B, it is possible to integrate the polarizing plate POL, the low refractive layer LR and the optical element OE in only one process because they have substantially a same size.

Next, referring to FIGS. 3A and 3B, there will be described about a case in which light emitted from the light source is converted into the progressing light by the optical element to travel in the display area, and a case in which after the progressing light is reflected by the object, the reflected light is converged to the optical sensor to sense an image of the object.

Referring to FIG. 3A, the light emitted from the light source LS is transmitted through the display panel DP, the polarizing plate POL and the low refractive layer LR, and incident to the light-incident element OE_I of the optical element OE. The light-incident element OE_I refracts the incident light at a first angle θ1 to cause total internal reflection in the cover substrate CS. Some of the light that has passed through the light-incident element OE_I travels to the black matrix BM, and the remaining of the light is refracted at the first angle θ1 to travel from the non-display area NDA to the display area DA. Accordingly, it is possible prevent the light from leaking in the non-display area NDA because the light arrived at the black matrix BM is blocked by the black matrix BM. The adhesive layer AD and the cover substrate CS disposed on the optical element OE and the cover substrate CS have substantially the same refractive index so that the light refracted from the light-incident element OE_I and then advancing in the display area DA is arrived at the upper surface of the cover substrate CS, and is totally internally reflected. The totally internally reflected light is transmitted through the cover substrate CS and the adhesive layer AD and is totally internally reflected again on the lower surface of the optical element OE. That is, since the refractive index of the optical element OE is substantially similar to that of the cover substrate and the adhesive layer, and the refractive index of the low refractive layer LR disposed under the optical element OE is smaller than that of the cover substrate, the light totally internally reflected at the upper surface of the cover substrate CS does not transmit the low refractive layer LR but is totally internally reflected by the low refractive layer LR, thereby traveling back to the cover substrate CS. Like this, some of the light emitted from the light source LS and refracted by the light-incident element OE_I is reflected by total internal reflection between the upper surface of the cover substrate CS and the lower surface of the optical element OE, thereby traveling to the area corresponding to the display area DA as shown in FIG. 3A. In FIG. 3A, in case that an object (for example, a finger) having a fingerprint F with biometric information is touched on the upper surface of the cover substrate CS, the light is absorbed when it meets the ridge R of the fingerprint F, but the light is reflected when it meets the valley V of the fingerprint F. Accordingly, the light traveling to the top surface of the cover substrate CS keeps a total-reflection state and progresses in the display area DA.

Referring to FIG. 3B, some of the light totally internally reflected at the upper surface of the cover substrate CS reaches to the light-exiting element OEO. The light scattered by patterns of the light-exiting element OE_O among the light reached the light-exiting element OE_O, reflected at a second angle θ2 smaller than the first angle θ1, and maintaining the total-reflection, is advanced into the cover substrate CS via the adhesive layer AD. At this time, when the finger is touched on the cover substrate CS, the light reached to the ridge R of the fingerprint F is absorbed, and the light reached to the valley V of the fingerprint F is reflected to transmit the adhesive layer AD, the optical element OE, the low refractive layer LR, the polarizing plate POL, and the display panel DP. The optical sensor OS located below the display panel DP senses the amount of light reflected by the ridge R and the valley V of the fingerprint F. The light sensed by the optical sensor OS can be used to reconstruct the fingerprint pattern of the finger after being supplied to an image sensing IC (not shown) through lead-out lines.

In the display device according to the embodiment of FIGS. 3A and 3B of this disclosure, it is possible to reconstruct an image sensed using the directional light unit and the optical sensor. Therefore, it is possible to correctly recognize a fine fingerprint without a complicated structure such as a bulky optical apparatus.

In addition, it is possible to easily adapt to a display panel having a reduced bezel area since a light-incident element of an optical element and a light source are disposed on the non-display portion of the display panel.

Hereafter, a display device according to a second embodiment of this disclosure is described with reference to FIGS. 4A and 4B.

Figure 4A:
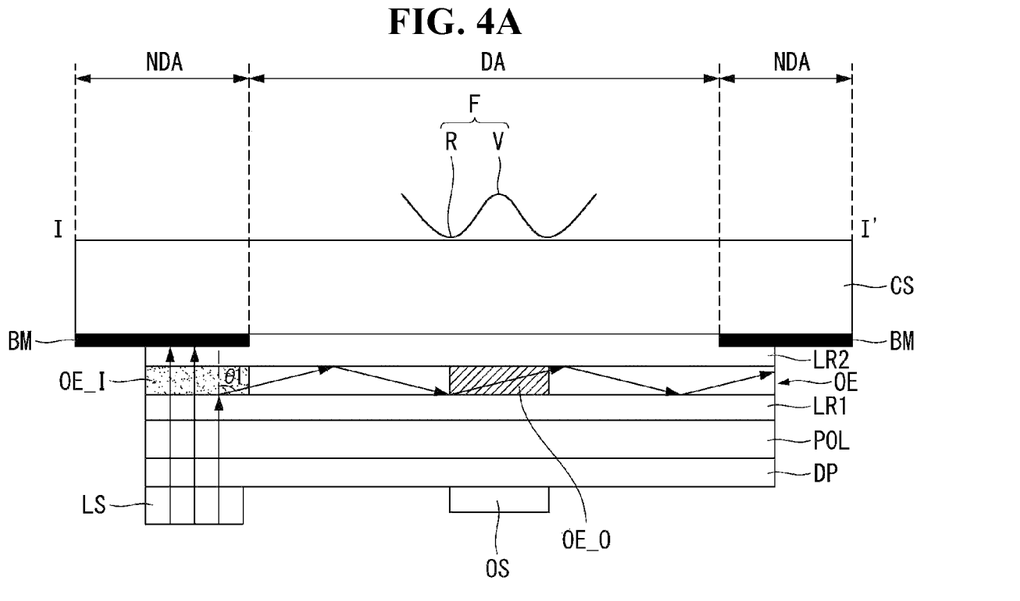
FIG. 4A is a cross-sectional view illustrating a display device according to a second embodiment of this disclosure taken along a line I-I' shown in FIG. 1A according to an embodiment of this disclosure, and showing a light path traveling through a total internal reflection in the directional light unit.

FIG. 4A is a cross-sectional view illustrating a display device according to a second embodiment of this disclosure taken along a line I-I' shown in FIG. 1A, and showing a light path traveling through a total internal reflection in the directional light unit. FIG. 4B is a cross-sectional view illustrating a display device according to the second embodiment of this disclosure taken along a line I-I' shown in FIG. 1A, and showing a light path in which the light refracted by a light-exiting element of the optical element is converged on an optical sensor.

Figure 4B:
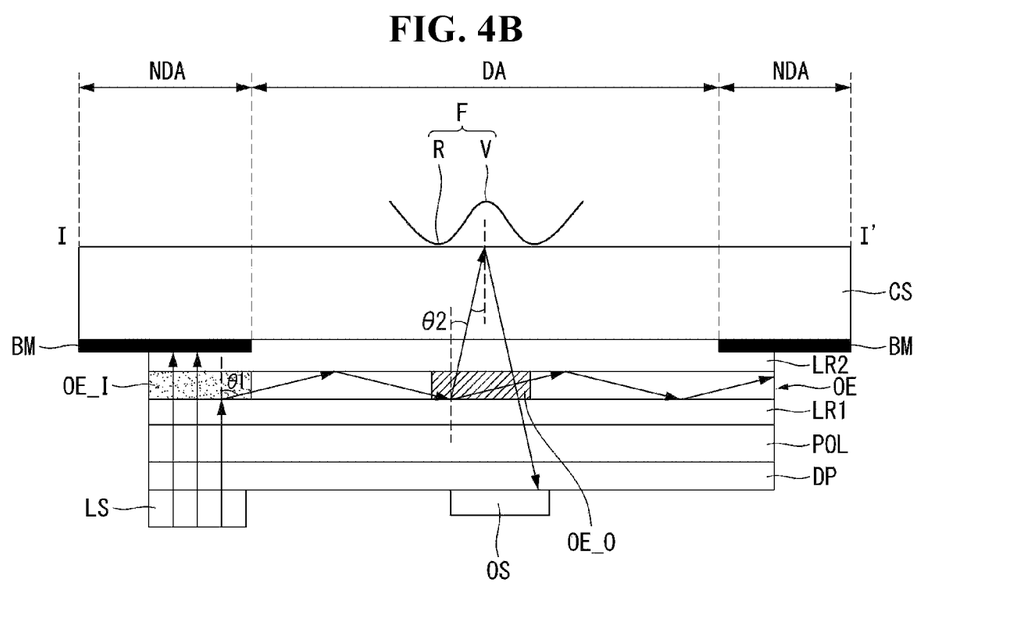
FIG. 4B is a cross-sectional view illustrating a display device according to the second embodiment of this disclosure taken along a line I-I' shown in FIG. 1A, and showing a light path in which the light refracted by a light-exiting element of the optical element is converged on an optical sensor according to an embodiment of this disclosure.

Referring to FIGS. 4A and 4B, the display device according to the second embodiment of this disclosure includes a display panel DP having a display area DA and a non-display area NDA, a light source LS disposed to correspond to the non-display area NDA, a directional light unit coupled with the display panel DP to progress and exit the light from the light source LS, and an optical sensor OS senses or detects the light from the directional light unit DLU.

As the display panel DP, any display panel may be used as long as the non-display area NDA can transmit light. In typical, a display panel of an electroluminescent display device using a flexible translucent substrate may be used. However, this disclosure is not limited thereto. A liquid crystal display (LCD), a plasma display panel (PDP), a field emission display (FED) or the like may be used in this disclosure if their non-display areas can transmit light. A polarizing plate POL may be attached to an upper side of the display panel DP to improve visibility.

The light source LS is disposed below the non-display area NDA of the display panel DP to irradiate the display panel DP with light. It is preferable to use a light source that supplies a collimated light capable of providing a light having a high collimation, such as an infrared laser.

The directional light unit may include a first low refractive layer LR1, an optical element OE, a second low refractive layer LR2 and a cover substrate CS. The directional light unit refracts the light supplied from the light source LS to progress it from the non-display area NDA to the display area DA in a total internal reflection, reflects some of the totally internally reflected light, and supplies the light reflected by an object having biometric information to the display panel DP and the optical sensor OS.

The cover substrate CS may include a predetermined area capable of recognizing the object having biometric information. The cover substrate CS can be made of transparent reinforced glass with a refractive index of about 1.5. A black matrix BM may be attached to the edge of the cover substrate CS to correspond to the light source LS. The object having biometric information may include a finger having a fingerprint F in which a plurality of valleys V and a plurality of ridges R are alternately arranged.

The first low refraction layer LR1 is disposed between the cover substrate CS and the display panel DP. The second low refraction layer LR2 is disposed between the cover substrate CS and the optical element OE. The first and second low refraction layers LR1 and LR2 may have a refractive index lower than that of the cover substrate CS in one embodiment. The refractive index of the first and second low refractive layers LR1 and LR2 is preferably similar to the refractive index of the object to be recognized. For example, when the display device of this disclosure is applied to fingerprint recognition, the first and second low refractive layers LR1 and LR2 may have a refractive index of about 1.4 similar to the refractive index of human skin of 1.39.

The optical element OE disposed between the first and second low refractive layers LR1 and LR2 include a light-incident element OE_I and a light-exiting element OE_O. The light-incident element OE_I and the light-exiting element OE_O are transparent holographic recording films. The refractive index of the light-incident element OE_I and the light-exiting element OE_O may be the same as or slightly larger than that of the cover substrate CS.

The light-incident element OE_I is disposed to correspond to the non-display area NDA, and is arranged so as to overlap the black matrix BM and the light source LS. The light-incident element OE_I refracts some of the light incident from the light source LS at a first angle $\theta 1$ which causes total internal reflection in the optical element OE, and progresses it to the optical element OE. Since the first low refractive layers LR1 having a refractive index smaller than the optical element OE is disposed under side of the optical element OE and the second low refractive layers LR2 having a refractive index smaller than the optical element OE is disposed upper side of the optical element OE, the light traveling into the optical element OE does not leak out of the optical element OE, but is progressed in a total-reflection in the optical element OE.

The light-exiting element OE_O may be disposed in at least a portion of area where light from the light source LS travels at a position corresponding to at least a portion of the image recognition area ISA defined by the progressing light. In this case, the light-exiting element OE_O may be separated from the light-incident element OE_I at a predetermined distance. The light-exiting element OE_O reflects the incident light at a second angle $\theta 2$ smaller than the first angle $\theta 1$ and exits the reflected light to the cover substrate CS. The light is reflected by the object, thereby progressing to the display panel DP and an optical sensor OS.

The optical sensor OS is disposed outside the display panel DP at a position corresponding to the light-exiting element OE_O of the optical element OE. The optical sensor OS senses the amount of light transmitted through the display panel DP.

In the embodiment of FIGS. 4A and 4B, it is possible to integrate the polarizing plate POL, the first low refractive layer LR1 and the optical element OE in only one process because they have substantially a same size.

Next, referring to FIGS. 4A and 4B, there will be described about a case in which light emitted from the light source is converted into the progressing light by the optical element to travel in the display area, and a case in which after the progressing light is reflected by the object, the reflected light is converged to the optical sensor to sense an image of the object.

Referring to FIG. 4A, the light emitted from the light source LS is transmitted through the display panel DP, the polarizing plate POL and the first low refractive layer LR1 and incident to the light-incident element OE_I of the optical element OE. The light-incident element OE_I refracts the incident light at a first angle $\theta 1$ to cause total internal reflection in the optical element OE. Some of the light that has passed through the light-incident element OE_I travel to the black matrix BM, and the remaining of the light is refracted at the first angle θ1 to travel from the non-display area NDA to the display area DA. Accordingly, it is possible prevent the light from leaking in the non-display area NDA because the light arrived at the black matrix BM is blocked by the black matrix BM. The light refracted from the light-incident element OE_I and then advancing in the display area DA is totally internally reflected in the optical element OE since the first and second low refraction layers LR1 and LR2 are respectively disposed on the lower surface and upper surface of the optical element OE. That is, the light totally internally reflected on the upper surface of the optical element OE is totally internally reflected again on the lower surface of the optical element OE, thereby advancing in a total-reflection state in the optical element OE. Like this, some of the light emitted from the light source LS and refracted by the light-incident element OE_I is incident to area corresponding to the display area DA by the total internal reflection between the upper surface of the optical element OE and the lower surface of the optical element OE as shown in FIG. 4A.

Referring to FIG. 4B, the light progressing in the total-reflection in the optical element OE reaches to the light-exiting element OE_O. The light reached to the light-exiting element OE_O is scattered by patterns of the light-exiting element OE_O and reflected at a second angle θ2 smaller than the first angle θ1. The light reflected at the second angle θ2 passes through the light-exiting element OE_O and then is travelled to the cover substrate CS via the second low refractive layer LR2. At this time, when the finger is touched on the cover substrate CS, the light reached to the ridge R of the fingerprint F is absorbed, and the light reached to the valley V of the fingerprint F is reflected to the second low refractive layer LR2, the optical element OE, the first low refractive layer LR1, the polarizing plate POL, and the display panel DP. The optical sensor OS located below the display panel DP senses the amount of light reflected by the ridge R and the valley V of the fingerprint F. The light sensed by the optical sensor OS can be used to reconstruct the fingerprint pattern of the finger after being supplied to an image sensing IC (not shown) through lead-out lines.

In the display device according to the embodiment of FIGS. 4A and 4B of this disclosure, it is possible to reconstruct an image sensed using the directional light unit and the optical sensor. Therefore, it is possible to correctly recognize a fine fingerprint without a complicated structure such as a bulky optical apparatus.

In addition, it is possible to easily adapt to a display panel having a reduced bezel area since a light-incident element of optical element and a light source are disposed on a non-display portion of a display panel.

In the display device according to the embodiment of FIGS. 4A and 4B of this disclosure, the optical element is disposed between the first low refractive layer and the second low refractive layer. Therefore, compared to the embodiment of FIGS. 3A and 3B in which the second low refractive layer is not provided, the scattered light is reduced, thereby capable of improving the resolution of the image sensed from the object without being affected by the scattered light.

Hereafter, a display device according to a third embodiment of this disclosure is described with reference to FIGS. 5A and 5B.

Figure 5A:
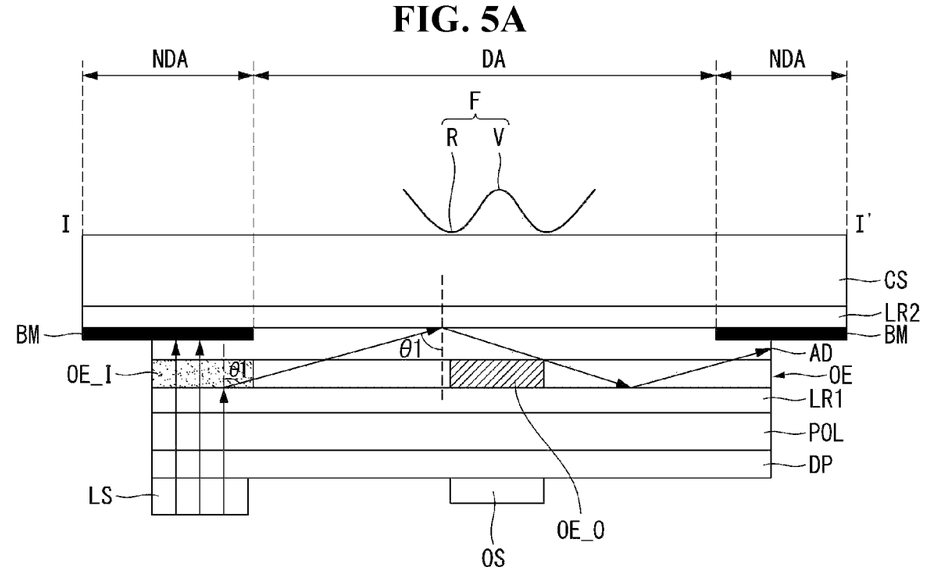
FIG. 5A is a cross-sectional view illustrating a display device according to a third embodiment of this disclosure taken along a line I-I' shown in FIG. 1A, and showing a light path traveling through a total internal reflection in the directional light unit according to an embodiment of this disclosure.

FIG. 5A is a cross-sectional view illustrating a display device according to a third embodiment of this disclosure taken along a line I-I' shown in FIG. 1A, and showing a light path traveling through a total internal reflection in the directional light unit. FIG. 5B is a cross-sectional view illustrating a display device according to the third embodiment of this disclosure taken along a line I-I' shown in FIG. 1A, and showing a light path in which the light refracted by a light-exiting element of the optical element is converged on an optical sensor.

Figure 5B:
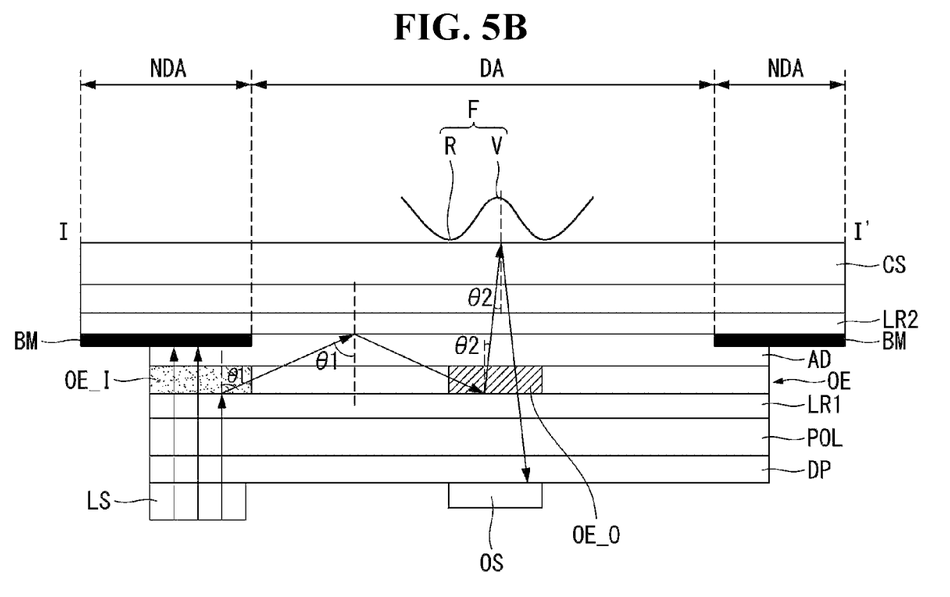
FIG. 5B is a cross-sectional view illustrating a display device according to the third embodiment of this disclosure taken along a line I-I' shown in FIG. 1A, and showing a light path in which the light refracted by a light-exiting element of the optical element is converged on an optical sensor according to an embodiment of this disclosure.

Referring to FIGS. 5A and 5B, the display device according to the third embodiment of this disclosure includes a display panel DP having a display area DA and a non-display area NDA, a light source LS disposed to correspond to the non-display area NDA, a directional light unit coupled with the display panel DP to progress and exit the light from the light source LS, and an optical sensor OS senses or detects the light from the directional light unit DLU.

As the display panel DP, any display panel may be used as long as the non-display area NDA can transmit light. In typical, a display panel of an electroluminescent display device using a flexible translucent substrate may be used. However, this disclosure is not limited thereto. A liquid crystal display (LCD), a plasma display panel (PDP), a field emission display (FED) or the like may be used in this disclosure if their non-display areas can transmit light. A polarizing plate POL may be attached to an upper side of the display panel DP to improve visibility.

The light source LS is disposed below the non-display area NDA of the display panel DP to irradiate the display panel DP with light. It is preferable to use a light source that supplies a collimated light capable of providing a light having a high collimation, such as an infrared laser.

The directional light unit may include a first low refractive layer LR1, an optical element OE, an adhesive layer AD, a second low refractive layer LR2 and a cover substrate CS. The directional light unit refracts the light supplied from the light source LS to progress it from the non-display area NDA to the display area DA in a total internal reflection, reflects some of the totally internally reflected light, and supplies the light reflected by an object having biometric information to the display panel DP and the optical sensor OS.

The cover substrate CS may include a predetermined area capable of recognizing the object having biometric information. The cover substrate CS can be made of transparent reinforced glass with a refractive index of about 1.5. The object having biometric information may include a finger having a fingerprint F in which a plurality of valleys V and a plurality of ridges R are alternately arranged.

The first low refraction layer LR1 is disposed between the cover substrate CS and the display panel DP.

The second low refraction layer LR2 is attached to a lower surface of the cover substrate CS between the cover substrate CS and the optical element OE. A black matrix BM may be attached to the edge of the second low refractive layer LR2 to correspond to the light source LS.

It is preferable that the first and second low refraction layers LR1 and LR2 have a refractive index smaller than that of the cover substrate CS. The refractive index of the first and second low refractive layers LR1 and LR2 may be similar to the refractive index of the object to be recognized in one embodiment. For example, when the display device of this disclosure is applied to fingerprint recognition, the first and second low refractive layers LR1 and LR2 may have a refractive index of about 1.4 similar to the refractive index of human skin of 1.39.

The optical element OE is disposed between the first and second low refractive layers LR1 and LR2. An adhesive layer AD may be disposed between the optical element OE and the second low refractive layer LR2 to couple the optical element OE with the second low refractive layers LR2.

The optical element OE disposed between the adhesive layer AD and the low refractive layers LR1 includes a light-incident element OE_I and a light-exiting element OE_O. The light-incident element OE_I and the light-exiting element OE_O are transparent holographic recording films. The refractive index of the light-incident element OE_I and the light-exiting element OE_O may be the same as or slightly larger than that of the cover substrate CS.

The light-incident element OE_I is disposed to correspond to the non-display area NDA, and is arranged so as to overlap the black matrix BM and the light source LS. The light-incident element OE_I refracts some of the light incident from the light source LS at a first angle θ1 which causes total internal reflection in the adhesive layer AD, and progresses it to the optical element OE. Since the first low refractive layers LR1 having a refractive index smaller than the optical element OE is disposed under side of the optical element OE, and the second low refractive layers LR2 having a refractive index smaller than the optical element OE is disposed upper side of the adhesive layer AD, the light traveling from the light incident element OE_I to the display area DA progresses in a total internal reflection between the upper surface of the adhesive layer AD and the lower surface of the optical element OE.

The light-exiting element OE_O may be disposed in at least a portion of area where light from the light source LS travels at a position corresponding to at least a portion of the image recognition area ISA defined by the progressing light. In this case, the light-exiting element OE_O may be separated from the light-incident element OE_I at a predetermined distance. The light-exiting element OE_O reflects the incident light at a second angle θ2 smaller than the first angle θ1 and exits the reflected light to the cover substrate CS. The light is reflected by the object, thereby progressing to the display panel DP and an optical sensor OS.

The optical sensor OS is disposed outside the display panel DP at a position corresponding to the light-exiting element OE_O of the optical element OE. The optical sensor OS senses the amount of light transmitted through the display panel DP.

In the embodiment of FIGS. 5A and 5B, it is possible to integrate the polarizing plate POL, the first low refractive layer LR1 and the optical element OE in only one process because they have substantially a same size.

Next, referring to FIGS. 5A and 5B, there will be described about a case in which light emitted from the light source is converted into the progressing light by the optical element to travel in the display area, and a case in which after the progressing light is reflected by the object, the reflected light is converged to the optical sensor to sense an image of the object.

Referring to FIG. 5A, the light emitted from the light source LS is transmitted through the display panel DP, the polarizing plate POL and the first low refractive layer LR1 and is incident to the light-incident element OE_I of the optical element OE. The light-incident element OE_I refracts the incident light at a first angle θ1 to cause total internal reflection in the adhesive layer AD.

Some of the light that has passed through the light-incident element OE_I travels to the black matrix BM, and the remaining of the light is refracted to travel from the non-display area NDA to the display area DA. Accordingly, it is possible prevent the light from leaking in the non-display area NDA because the light arrived at the black matrix BM is blocked by the black matrix BM.

The light refracted from the light-incident element OE_I and then advancing in the display area DA is totally internally reflected between the upper surface of the adhesive layer AD and the lower surface of the optical element OE since the first low refraction layers LR1 is disposed on the lower surface of the optical element OE, and the second low refraction layers LR2 is disposed on the upper surface of the adhesive layer AD. The light totally internally reflected on the upper surface of the adhesive layer AD is totally internally reflected again on the lower surface of the optical element OE, thereby advancing in a total-reflection state in the adhesive layer AD and the optical element OE. Like this, some of the light emitted from the light source LS and refracted by the light-incident element OE_I travel to a region corresponding to the display area DA by total internal reflection between the upper surface of the adhesive layer AD and the lower surface of the optical element OE as shown in FIG. 5A.

Referring to FIG. 5B, the light progressing in the total-reflection in the adhesive layer AD and the optical element OE reaches to the light-exiting element OE_O. The light reached to the light-exiting element OE_O is scattered by patterns of the light-exiting element OE_O and reflected at a second angle θ2 smaller than the first angle θ1. The light reflected in the light-exiting element OE_O progresses in the cover substrate CS via the adhesive layer AD and the second low refractive layer LR2. At this time, when the finger is touched on the cover substrate CS, the light reached to the ridge R of the fingerprint F is absorbed, and the light reached to the valley V of the fingerprint F is reflected, thereby transmitting the second low refractive layer LR2, the adhesive layer AD, the optical element OE, the first low refractive layer LR1, the polarizing plate POL, and the display panel DP. The optical sensor OS located below the display panel DP senses the amount of light reflected by the ridge R and the valley V of the fingerprint F. The light sensed by the optical sensor OS can be used to reconstruct the fingerprint pattern of the finger after being supplied to an image sensing IC (not shown) through lead-out lines.

In the display device according to the embodiment of FIGS. 5A and 5B of this disclosure, it is possible to reconstruct an image sensed using the directional light unit and the optical sensor. Therefore, it is possible to correctly recognize a fine fingerprint without a complicated structure such as a bulky optical apparatus.

In addition, it is possible to easily adapt to a display panel having a reduced bezel area since the light-incident element of the optical element and the light source are disposed on the non-display portion of the display panel.

In the display device according to the embodiment of FIGS. 5A and 5B of this disclosure, the display device may be provided with the adhesive layer between the second low refractive layer and the optical element, thereby increasing a pitch of the traveling light travelling between the first low refractive layer and the second low refractive layer. Therefore, compared to the embodiment of FIGS. 4A and 4B, it is possible to improve the resolution of the image sensed from the object by further reducing affection by the scattered light.

Those skilled in the art will understand that the disclosure may be changed and modified in various ways without departing from the disclosure through the aforementioned contents. Accordingly, the technical scope of the disclosure is not limited to the contents described in the detailed description of the specification, but should be determined by the claims.

What is claimed is:

1. A display device comprising:
a display panel having a display area and a non-display area outside the display area;
a light source disposed below the non-display area of the display panel to irradiate the display panel with light;
a cover substrate disposed on an upper portion of the display panel to refract the light supplied from the light source at a first angle to travel from the non-display area to the display area in total internal reflection, and reflect some of the totally internally reflected light at a second angle to an object having biometric information;
an optical film disposed between the cover substrate and the display panel, the optical film including:
a first transparent holographic recording film disposed in at least a portion of a region where the light from the light source travels to supply a light reflected by the object to the display panel; and
a second transparent holographic recording film disposed to be overlapped with the light source at a position corresponding to the non-display area; and
an optical sensor disposed below the display panel and receiving the light traveling through the first transparent holographic recording film and the display panel.

2. The display device of claim 1, further comprising:
a first low refractive layer disposed between the optical film and the display panel.

3. The display device of claim 2, further comprising a second low refractive layer disposed between the optical film and the cover substrate.

4. The display device of claim 2, further comprising:
an adhesive layer disposed between the optical film and the cover substrate; and
a black matrix disposed to overlap the second transparent holographic recording film and disposed between the cover substrate and the adhesive layer to block some of the light irradiated from the light source.

5. The display device of claim 3, further comprising a black matrix disposed to correspond to the second transparent holographic recording film and disposed between the cover substrate and the second low refractive layer to block some of the light irradiated from the light source.

6. The display device of claim 3, further comprising:
an adhesive layer disposed between the optical film and the second low refractive layer; and
a black matrix disposed to overlap second transparent holographic recording film between the adhesive layer and the second low refractive layer to block some of the light irradiated from the light source.

7. The display device of claim 4, wherein the second transparent holographic recording film refracts some of the light incident from the light source at the first angle so as to cause total internal reflection in the cover substrate and make the some of the light travel in the cover substrate and the optical film, and
wherein the light totally internally reflected from an upper surface of the cover substrate and traveling to the second transparent holographic recording film is reflected at the second angle smaller than the first angle by the first low refractive layer to be traveled to the cover substrate, and is traveled to the optical sensor after being reflected by the object on the cover substrate.

8. The display device of claim 5, wherein the second transparent holographic recording film refracts some of the light incident from the light source at the first angle so as to cause total internal reflection in the optical film and make the some of the light travel in the optical film, and
wherein the light totally internally reflected from an upper surface of the optical film and traveling to the first transparent holographic recording film is reflected at the second angle smaller than the first angle to be traveled to the cover substrate, and is travelled to the optical sensor after being reflected by the object on the cover substrate.

9. The display device of claim 6, wherein the second transparent holographic recording film refracts some of the light incident from the light source at the first angle so as to cause total internal reflection in the adhesive layer and make the some of the light travel in the adhesive layer and the optical film, and
wherein the light totally internally reflected from an upper surface of the adhesive layer and traveling to the first transparent holographic recording film is reflected at the second angle smaller than the first angle to be traveled to the cover substrate, and is travelled to the optical sensor after being reflected by the object on the cover substrate.

10. The display device of claim 7, wherein refractive indexes of the cover substrate, the adhesive layer, and the optical film are the same, and the refractive index of the cover substrate is larger than a refractive index of the first low refractive layer.

11. The display device of claim 8, wherein refractive indexes of the cover substrate and the optical film are the same, a refractive index of the first low refractive layer is the same as that of the second low refractive layer, and a refractive index of the cover substrate is larger than that of the first low refractive layer.

12. The display device of claim 9, wherein refractive indexes of the cover substrate, the adhesive layer and the optical film are the same, a refractive index of the first low refractive layer is the same as that of the second low refractive layer, and a refractive index of the cover substrate is larger than that of the first low refractive layer.

13. The display device of claim 2, wherein the display panel further comprises a polarizing plate disposed between the display panel and the first low refractive layer, and the polarizing plate, the first low refractive layer, and the optical film are substantially similar in size.

14. The display device of claim 2, wherein the display panel further comprises signal lines arranged to bypass a region overlapping the second transparent holographic recording film of the optical film and the light source.

15. The display device of claim 1, wherein the object includes a fingerprint in which a plurality of ridges and a plurality of valleys are alternately arranged.

* * * * *